US006956656B2

(12) United States Patent
Hill

(10) Patent No.: US 6,956,656 B2
(45) Date of Patent: Oct. 18, 2005

(54) INTERFEROMETRIC SERVO CONTROL SYSTEM FOR STAGE METROLOGY

(75) Inventor: Henry A. Hill, Tucson, AZ (US)

(73) Assignee: Zygo Corporation, Middlefield, CT (US)

(*) Notice: Subject to any disclaimer, the term of this patent is extended or adjusted under 35 U.S.C. 154(b) by 3 days.

(21) Appl. No.: 10/819,257

(22) Filed: Apr. 5, 2004

(65) Prior Publication Data

US 2004/0189998 A1 Sep. 30, 2004

Related U.S. Application Data

(63) Continuation of application No. 09/879,428, filed on Jun. 12, 2001, now Pat. No. 6,747,744.
(60) Provisional application No. 60/252,108, filed on Nov. 20, 2000.

(51) Int. Cl.[7] ................................................ G01B 9/02
(52) U.S. Cl. ...................... 356/500; 356/498; 356/486
(58) Field of Search ............................. 356/486, 493, 356/498, 500

(56) References Cited

U.S. PATENT DOCUMENTS

| | | | |
|---|---|---|---|
| 4,413,908 A | 11/1983 | Abrams et al. | |
| 4,948,254 A | 8/1990 | Ishida | |
| 5,331,400 A | 7/1994 | Wilkening et al. | |
| 5,404,222 A | 4/1995 | Lis | |
| 5,483,343 A | 1/1996 | Iwamoto et al. | |
| 5,663,793 A | 9/1997 | de Groot | |
| 5,940,180 A | 8/1999 | Ostby | |
| 5,969,800 A | 10/1999 | Makinouchi | |
| 6,008,902 A | 12/1999 | Rinn | |
| 6,137,574 A * | 10/2000 | Hill | 356/486 |
| 6,181,420 B1 | 1/2001 | Badami et al. | |
| 6,252,668 B1 | 6/2001 | Hill | |
| 2002/0048026 A1 | 4/2002 | Isshiki et al. | |

FOREIGN PATENT DOCUMENTS

| | | |
|---|---|---|
| JP | 351078 | 12/1995 |
| JP | 117083 | 4/1996 |

OTHER PUBLICATIONS

Badami V.B. et al., "Investigation of Nonlinearity in High Accuracy Heterodyne Laser Interferometry," 1997 Proceedings, vol. 16, pp. 153–156.
Bobroff, N., "Recent Advances in Displacement Measuring Interferometry," Measurement Science & Technology, vol. 4, Lo. 9, Sep. 1993, pp. 907–926.
Hines, B. et al., "Sub–Nanometer Laser Metrology—Some Techniques and Models," Jet Propulsion Laboratory, California Institute of Technology, pp. 1195–1204.

(Continued)

Primary Examiner—Gregory J. Toatley, Jr.
Assistant Examiner—Patrick J. Connolly
(74) Attorney, Agent, or Firm—Fish & Richardson P.C.

(57) ABSTRACT

The invention features a method for determining non-linear cyclic errors in a metrology system that positions a measurement object under servo-control based on an interferometrically derived position signal. The method includes: translating the measurement object under servo-control at a fixed speed; identifying frequencies of any oscillations in the position of measurement object as it is translated at the fixed speed; and determining amplitude and phase coefficients for sinusoidal components at the identified frequencies which when combined with the position signal suppress the oscillations. The invention also features a method for positioning a measurement object under servo-control based on an interferometrically derived position signal indicative of a position for the measurement object. This method includes: generating a compensated position signal based on the interferometrically derived position signal and at least one correction term that has a sinusoidal dependence on the position of the measurement object; and repositioning the measurement object based on the compensated position signal and a desired position for the measurement object.

4 Claims, 1 Drawing Sheet

OTHER PUBLICATIONS

Oka K. et al., "Polarization Heterodyne Interferometry Using Another local Oscillator Beam," Optics Communications, 92 (1982), 1–5.

Wu, C.M. et al., Analytical Modeling of the Periodic Nonlinearity in Heterodyne Interferometry Applied Optics, vol. 37, No. 28, Oct. 1, 1998, pp. 6696–6700.

* cited by examiner

INTERFEROMETRIC SERVO CONTROL SYSTEM FOR STAGE METROLOGY

CROSS-REFERENCE TO RELATED APPLICATIONS

Pursuant to 35 U.S.C. §120, this application is a continuation of and claims the benefit of prior U.S. application 09/879,428, filed Jun. 12, 2001 now U.S. Pat. No. 6,747,744, which claims priority under 35 U.S.C. §119(e) to Provisional Patent Application No. 60/252,108, filed Nov. 20, 2000. The contents of the prior applications are incorporated herein by reference in their entirety.

BACKGROUND

Microlithography and electron beam writing are examples of applications that generate precise patterns on a sample, such as a semiconductor wafer or mask. Such applications require accurate placement and/or movement of the sample stage relative to the writing tool. Often, accurate positioning of different components within the writing tool, such as the relative position of a reticle in a lithography tool, also requires accurate positioning.

To enable such accurate positioning, heterodyne distance measuring interferometers are often used to measure distance changes along one or more axes. The distance measurements can provide a control signal that drives a servo system for accurately positioning different components of a given system.

A heterodyne distance measuring interferometer measures chances in the position of a measurement object relative to a reference object based on optical interference generated by overlapping and interfering a measurement beam reflected from a measurement object with a reference beam. Measurement of the optical interference produces an interference intensity signal that oscillates at a heterodyne angular frequency $\omega$ corresponding to small difference in frequency between the measurement and reference beams. Changes in the relative position of the measurement object correspond to changes in the phase $\phi$ of the oscillating intensity signal, with a $2\pi$ phase change substantially equal to a distance change L of $\lambda/(np)$, where L is a round-trip distance change, e.g., the change in distance to and from a stage that includes the measurement object, $\lambda$ is the wavelength of the measurement and reference beams, n is the refractive index of the medium through which the light beams travel, e.g., air or vacuum, and p is the number of passes to the reference and measurement objects.

Unfortunately, this equality is not always exact. Many interferometers include non-linearities such as what are known as "cyclic errors." Some cyclic errors can be expressed as contributions to the phase and/or the intensity of the measured interference signal and have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2(2\pi pnL)/\lambda$. Higher order and sub-harmonic cyclic errors can also be present.

SUMMARY

The invention relates to metrology systems in which an interferometric measurement provides a control signal for a servo system that positions a device, such as a lithographic stage. The applicant has recognized that, in the absence of any cyclic error compensation, cyclic errors in the interferometric measurement are a source of a false error signal in the servo system and can cause deviations in the desired position of the device, e.g., stage oscillations. In particular, depending on properties of the complex open-loop gain of the servo system as a function of frequency, the deviations can comprise oscillations with amplitudes that are either as large as the magnitude of the cyclic error(s) in the interferometric measurement or significantly exceed the magnitude of the cyclic error(s). Such deviations, however, provide an observable for identifying and quantifying such cyclic errors. The quantified cyclic errors can be used to generate a compensation signal that corrects the interferometric control signal and thereby eliminating the source of the false error signal in the servo system and improves the accuracy of the stage metrology system.

In general, in one aspect, the invention features a method for determining nonlinear cyclic errors in a metrology system that positions a measurement object (e.g., a stage in a lithography or beam writing tool) under servo-control based on an interferometrically derived position signal. The method includes: translating the measurement object under servo-control at a fixed speed; identifying frequencies of any oscillations in the position of measurement object as it is translated at the fixed speed; and determining amplitude and phase coefficients for a sinusoidal correction term at one of the identified frequencies which when combined with the position signal suppress the oscillations at that frequency.

Embodiments of the method may further include any of the following features.

The method may further include the steps of: repeating the translating, identifying, and determining steps for each of multiple, additional fixed speeds; and generating a representation of the nonlinear cyclic errors based on the coefficients and identified frequencies corresponding to the oscillations at each of the fixed speeds.

In some embodiments, the interferometrically derived position signal is the phase of an interferometric intensity signal at a heterodyne frequency. In other embodiments, the interferometrically derived position signal is a heterodyne, interferometric intensity signal.

To combine the sinusoidal correction signal with the position signal, the sinusoidal correction term may be, for example, subtracted from or added to the position signal to suppress the oscillations.

In general, in another aspect, the invention features a method for positioning a measurement object (e.g., a stage in a lithography or beam writing tool) under servo-control based on an interferometrically derived position signal indicative of a position for the measurement object. The method includes: generating a compensated position signal based on the interferometrically derived position signal and at least one correction term that has a sinusoidal dependence on the position of the measurement object; and repositioning the measurement object based on the compensated position signal and a desired position for the measurement object.

Embodiments of the method may include any of the following features.

For example, the generation of the compensated position signal may include: determining a speed for the measurement object based on the interferometrically derived position signal, and selecting parameters for the at least one sinusoidal correction term based on the determined speed.

The compensated position signal may be generated by subtracting the at least one sinusoidal correction term from the interferometrically derived position signal.

The interferometrically derived position signal may be the phase of an interferometric intensity signal at a heterodyne frequency. Alternatively, the interferometrically derived position signal may be a heterodyne, interferometric intensity signal.

The at least one sinusoidal correction term may include multiple sinusoidal correction terms (e.g., two, three, or more such terms). Each of the multiple sinusoidal correction terms may correspond to a cyclic error in the interferometrically derived position signal.

In general, in another aspect, the invention features an electronic processing system for use with a servo-system for positioning a measurement object. The electronic processing system includes: an input port configured to receive a position signal from an interferometry system indicative of a position for the measurement object; a memory storing a representation of nonlinear errors in the interferometry system; a processor which during operation generates a compensated position signal based on the position signal from the interferometry system and the stored representation; and an output port configured to direct the compensated position signal to a servo-controller.

Embodiments of the electronic processor may include any of the following features.

For example, the stored representation of nonlinear errors may be expressed as a sum of multiple correction terms each having a sinusoidal dependence on the position of the measurement object.

The stored representation of nonlinear errors may be parameterized by a speed of the measurement object. For example, during operation the processor may further determine an estimate for the speed of the measurement object based on the position signal from the interferometry system, and generate the compensated position signal based on the position signal from the interferometry system, the stored representation of nonlinear errors, and the estimated speed.

Other features, objects, and advantages of the invention will be apparent from the description and drawings, and from the claims.

DETAILED DESCRIPTION

Figure 1:
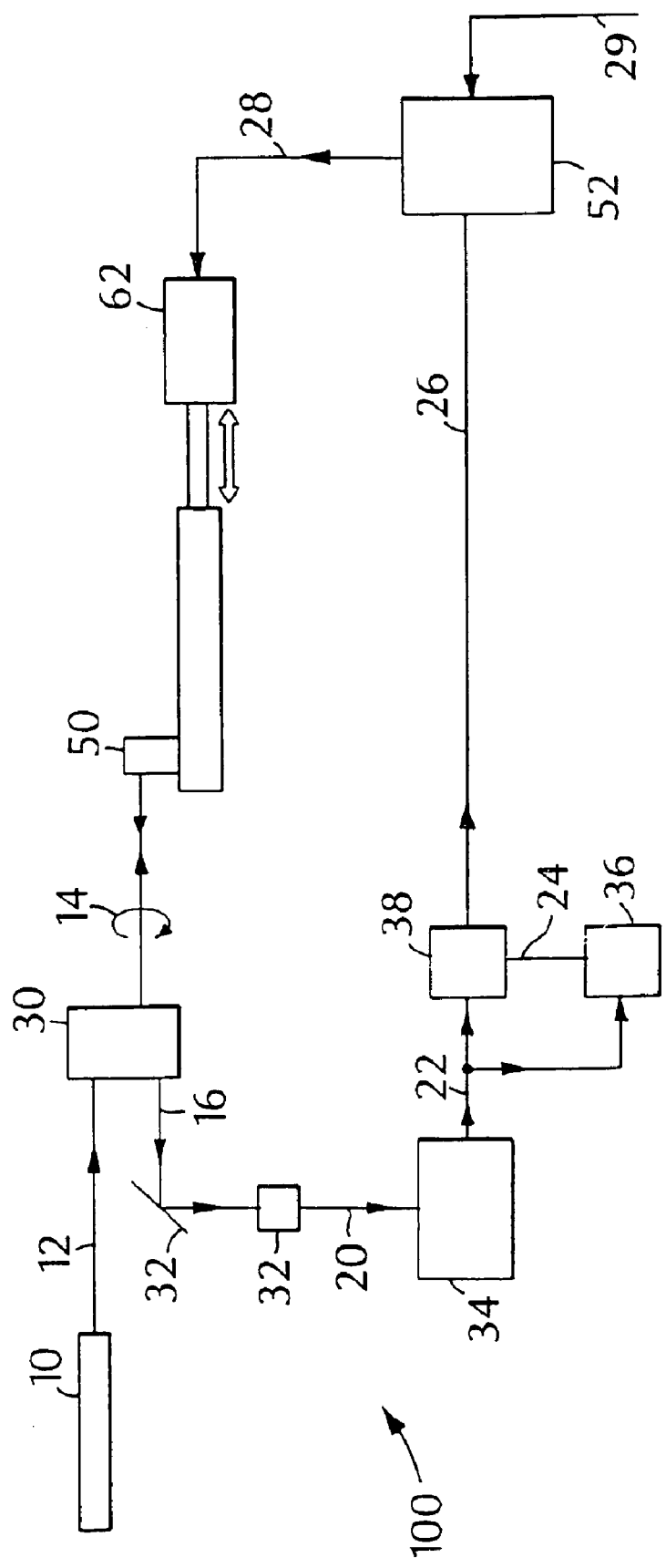
FIG. 1 is a schematic diagram of a servo-controlled stage metrology system.

The invention features a method for identifying and quantifying cyclic errors in a servo-controlled interferometric metrology system. Once quantified, cyclic errors in the interferometric control signal can be removed to suppress errors that may otherwise cause oscillations in the metrology system because of positive feedback.

Interferometry systems that quantify and compensate for non-linearities, such as a cyclic errors, and the application of such interferometry systems to microlithography and beam writing applications are disclosed in the following U.S. patent and U.S. patent applications, the contents of which are incorporated herein by reference: U.S. Pat. No. 6,137,574 to Henry Allen Hill entitled "Systems and Methods for Characterizing and Correcting Cyclic Errors in Distance Measuring and Dispersion Interferometry;" U.S. patent application Ser. No. 09/557,338 filed Apr. 24, 2000, by Henry Allen Hill entitled "Systems and Methods for Quantifying Nonlinearities in Interferometry Systems;" and U.S. patent application Ser. No. 09/583,368 filed May 30, 2000, by Henry Allen Hill entitled "Systems and Methods for Quantifying Nonlinearities in Interferometry Systems."

FIG. 1 is a schematic diagram of a stage metrology system 100, which includes a translatable stage 60 for supporting, e.g., a wafer or reticle in a microlithography tool, a translator 62 for translating stage 60 along an axis, and an interferometer 30 for measuring the translations along the axis.

During operation, source 10 generates an input beam 12 including two coextensive orthogonally polarized components that are frequency-shifted one with respect to the other. In the presently described embodiment, source 10 includes a coherent source of a single frequency optical beam such as a laser and an acousto-optical modulator to generate the two frequency-shifted components of beam 12. In other embodiments, source 10 can be, for example, a laser source that generates the frequency-shifted components intracavity, such as in a Zeeman-split laser. Input beam 12 is incident on interferometer 30. One frequency component of beam 12 defines a measurement beam 14 that contacts a mirror 50 connected to stage 60 and is subsequently reflected back to interferometer 130. The other frequency component defines a reference beam, which interferometer 30 combines with the reflected measurement beam to form an output beam 16. Interferometer 30 can be any of a number of interferometers, for example, it can be a single-pass dynamic interferometer (see, e.g., PCT application US99/19904 filed Aug. 31, 1999), a double-pass high stability plane mirror interferometer, a double-pass differential plane mirror interferometer, or some other angle or linear displacement interferometer such as those described in the article entitled "Differential interferometer arrangements for distance and angle measurements: Principles, advantages and applications" by C. Zanoni, *VDI Berichte* Nr. 749, 93–106(1989).

Referring again to FIG. 1, mirror 32 reflects output beam 16 to detector 32, which measures the intensity of the output beam using, for example, a quantum photon process. to produce an electronic interference signal, heterodyne signal 20. The phase of heterodyne signal 20 is related to the linear displacement of stage 60. In particular, in the absence of any non-linearities such cyclic errors, signal 20 can be expressed as s(t) where $$s(t) = a\ \cos(\omega t + \phi + \zeta), \quad (1)$$

$$\phi = Lkn, \quad (2)$$

where L is the linear displacement given by the physical path length difference between the reference and measurement paths. k is the wavenumber of the measurement beam. n is the refractive index within the interferometer. ω is the angular difference frequency between the measurement and reference beams. t is time, a is an amplitude that is constant with respect to φ, and ζ is a phase offset that is constant with respect to φ and φ̇, where φ̇ is the first derivative of φ with respect to time. In the subsequent treatment, we set ζ=0. Detector 32 transmits signal 20 in, e.g., a digital format, to electronic processor 34, which determines the phase φ of signal 20 by a phase detector using, for example, a fast Fourier transform of signal 20.

In the presence of non-linearities, however, such as those described in the U.S. Patents and Patent Applications incorporated by reference above, the phase determined by electronic processor 34 is φ'=φ+ψ, where is ψ corresponds to a contribution from non-linearities, which can generally be expressed as:

$$\psi = \sum_n A_n \cos(\omega_n t + p_n \varphi + \zeta_n) \quad (3)$$

where $A_n$, $\zeta_n$, $\omega_n$, and $p_n$ are the amplitude, phase offset, frequency, and harmonic index, respectively, of the nth nonlinear term. The harmonic index $p_n$ can take on integer and fractional values. Also, for many nonlinear terms, the frequency $\omega_n$ is zero. For example, the first harmonic cyclic error corresponds to a value of one for $p_n$ and a value of zero for $\omega_n$. As described in the U.S. Patents and Patent Applications incorporated herein by reference above, other types of cyclic errors, such as non-linearity in detector 32 and aliasing effects, can produce additional values for $p_n$ such as sub-harmonic values and frequencies dependent upon the sampling frequency of an analog-to-digital converter used in conversion of s(t) to a digital format. Furthermore, the amplitude and phase of each nonlinear term often varies with the speed of the stage, which is related to the instantaneous rate of change of phase $\phi$, denoted as $\dot{\phi}$.

Electronic processor 34 sends a signal 22 indicative of the determined phase $\phi'$ to both electronic processors 36 and 38. Electronic processor 36 stores a quantified representation of at least one or some of the non-linearities generally present in the interference signal because of imperfections in interferometer 30. For example, electronic processor 36 can store values of the nonlinear coefficients $A_n$, $\zeta_n$, $\omega_n$, and $p_n$ for at least one or some of the nonlinear terms, which permit it to estimate the value of $\psi$ from the value of $\phi'$ in signal 22. Such determination can, for example, involve an iterative calculation of $\psi$ based on the initial assumption that $\phi \approx \phi'$.

Where necessary, electronic processor 36 also stores the stage speed dependence of the quantified non-linearities. For example, the amplitude and phase estimates stored by electronic processor 36 for the nonlinear coefficients can be parameterized with respect to $\dot{\phi}'$, in other words, the stored estimates can be indicative of $A_n(\dot{\phi})$ and $\zeta_n(\dot{\phi})$. In such embodiments, electronic processor 34 determines values for the phase $\phi$, and its instantaneous rate of change $\dot{\phi}$, and sends both values to electronic processor 36 as signal 22. Electronic processor 36 then approximates $\dot{\phi} \approx \dot{\phi}'$ to determine the stage speed dependence of $A_n(\dot{\phi})$ and $\zeta_n(\dot{\phi})$ or alternatively, determines $\dot{\phi}$ from $\dot{\phi}'$ in an iterative process. In other embodiments, electronic processor 36 can receive an additional input from an independent source that monitors the stage speed. In any case, electronic processor 36 uses its stored, quantified representation to determine the nonlinear contribution $\psi$ to the phase $\phi'$ determined by electronic processor 34.

Electronic processor 36 sends the determined value for $\psi$ to electronic processor 38 as compensation signal 24. Electronic process 38 then uses compensation signal 24 to remove the estimated nonlinear contributions from the measured phase $\phi'$ and generate a compensated signal 26 indicative of the phase $\phi$, which is directly related to the stage displacement through Equation 2. Electronic processor 36 sends the compensation signal 26 to servo controller 52, which compares the stage displacement indicated by signal 26 to the desired stage displacement corresponding to an input control signal 29 to generate a servo signal 28. Servo controller then sends servo signal 28 to translator 62 to correct any deviation of the translation of the stage 60 from a desired translation time course. Generally, translator 62 may also receive an additional signal (not shown) similar to input control signal 29 (which provides the desired stage translation time course) for coarsely translating stage 60, with the interferometrically driven servo-system providing fine translation adjustment.

In other embodiments, the representation of the quantified non-linearities in electronic processor 36 can be with respect the intensity of the interference signal rather than its phase at the heterodyne angular difference frequency $\omega$. In such embodiments, the interferometric intensity signal measured by the detector may be expressed as:

$$s'(t) = s(t) + s_{NL}(t) \quad (4)$$

where s'(t) is the measured intensity, s(t) is the intensity that would be measured in the absence of any non-linearities, and $s_{NL}(t)$ is the nonlinear contribution to the measured intensity. The non-linearities are then expressed as a sum of sinusoidal contributions. e.g., $$s_{NL}(t) = \sum_q B_q \left\{ \sum_{u,p} a_{up} \cos(u\omega t + p\varphi + \zeta_{up}) \right\}^q \quad (5)$$

where p=1,2,3 . . . and fractional values, u=0 or 1, and q=1,2,3 . . . and where the "q" index is associated with non-linearity in detector 32. Thus, in such embodiments, electronic processor 36 can, for example, store the amplitude and phase coefficients for at least one or some of the nonlinear terms in Equation (5) and, where appropriate, their stage speed dependence.

Furthermore, in such embodiments, electronic processor 34 can determine $\phi'$ from s'(t) and send s'(t), $\phi'$, and $\dot{\phi}'$ to electronic processor 36 and s'(t) to electronic processor 38 as signal 22. Electronic processor 36 then determines an estimate for $s_{NL}(t)$ based on the stored quantified non-linearities and sends that estimate to electronic processor 38 as signal 24. In turn, electronic processor 38 removes the nonlinear contribution $s_{NL}(t)$ from the measured intensity the measured intensity s'(t) to provide a compensated estimate for s(t), determines the phase $\phi$, which is directly related to the stage displacement through Equation 2, and generates compensated signal 26 indicative of the phase. Electronic processor 38 sends the compensation signal 26 to servo controller 52, as in the first embodiment.

In any of these embodiments, the quantified representation of non-linearities stored by electronic processor 36 can be determined by any of the methods described in the U.S. Patents and Applications incorporated herein by reference above. They can also be determined through another method described below.

Applicant has recognized that non-linear contributions in signal 26 sent to servo controller 52 can produce a false error signal in the servo system that cause stage oscillations that may be as large as or greatly exceed the amplitude of the non-linear errors in the interferometrically measured displacement.

Consider, for example, a stage translation speed of 25 micron/sec and a double pass interferometer used to measure the corresponding translation and provide the error signal to the servo controller. For this example, the first harmonic cyclic error will have a frequency of 158.0 Hz for a Helium Neon source laser operating at 633 nm, and the one-half sub-harmonic cyclic error will have a corresponding frequency of 79.0 Hz. Both of these frequencies are typically within the bandwidth of the servo system, and can therefore lead to stage oscillations at these frequencies. The cyclic error amplitude required to produce an unacceptable level of stage oscillation will depend on the complex open-loop gain of the servo system. However, cyclic error amplitudes of the order of nanometers may generate an unacceptable level of stage oscillation. Frequencies of cyclic errors that lead to substantially positive feedback in the servo system generate the largest amplitudes in stage oscillation. Such stage translations of the order of 25 micron/sec along an axis can arise during, for example, an alignment procedure. They can also occur during a high-speed translation along a second axis wherein the stage mirror for the first axis is not orthogonal to the translation axis associated with the second axis by an angle of the order of 100 microradians.

Nonetheless, observation of such stage oscillations provides a method of identifying and quantifying those cyclic errors that produce the stage oscillations.

First, one translates the stage at a fixed speed under closed loop servo control. For example, the stage metrology system 100 is operated with input control signal 29 set for a constant translation speed. If feedback of one or more non-linearities in interferometric signal 20 occurs at that speed, stage oscillations result and correspond to an oscillatory deviation of stage 60 from desired speed at one or more corresponding frequencies. One can measure such deviations from the phase $\phi'$ determined by electronic processor 34 because the non-linear error in $\phi'$ serving as a false error source will typically be of the order of the stage oscillation amplitude or small compared to the stage oscillation amplitude. Alternatively, one can independently measure the stage oscillations using, e.g., a mechanical or machine vision measurement.

One can then determine the frequency components of oscillatory deviations by Fourier analysis. The resulting frequencies equal the $\omega_n + p_n \dot{\phi}$ frequencies in Equation (3). For each of these frequencies, electronic processor 36 determines $\omega_n$ and $p_n$ by assuming that $\dot{\phi} \approx \dot{\phi}'$. Then, for each frequency, electronic processor 36 iteratively determines amplitude $A_n$ and phase offset $\zeta_n$ coefficients for a correction term. $A_n \cos(\omega_n t + p_n \phi' + \zeta_n)$, which, when subtracted from the measured phase $\phi'$ in electronic processor 38, provides a compensated signal 26 to servo controller 52 that suppresses the stage oscillations at that frequency. Alternatively, the electronic processor can determine the coefficients by adding the correction term to the measured phase, in which case the phase offset $\zeta_n$ coefficient will shift by $\pi$ radians.

Once all of the stage oscillation frequencies have been suppressed, the process is repeated at additional fixed speeds for the stage to determine the frequencies and corresponding amplitude and phase coefficients at each new speed. The resulting frequencies and coefficients are stored in electronic processor 36 to define, or add to, the stored quantified nonlinear representation used during normal operation.

The quantification method can be applied similarly to embodiments where the non-linearities are expressed as sinusoidal contributions to the intensity measured by detector 32, s'(t).

Other aspects, advantages, and modifications are within the scope of the following claims.

What is claimed is:

1. A method comprising:
   measuring values of a distance measuring interferometry signal for a first period of time;
   using the values from the first period of time to determine one or more correction factors for the distance measuring interferometry signal, wherein the correction factors relate to cyclic errors in a distance measuring interferometer used to produce the distance measuring interferometry signal;
   measuring at least one value of the distance measuring interferometry signal during a second period of time following the first period of time; and
   correcting the value from the second period of time based on the correction factors.

2. The method of claim 1, wherein the one or more correction factors comprises multiple correction factors.

3. The method of claim 2, wherein the at least one value from the second period of time comprise multiple values.

4. The method of claim 1, wherein the at least one value from the second period of time comprise multiple values.

* * * * *